(12) United States Patent  
Fukaya et al.

(10) Patent No.: US 9,158,192 B2
(45) Date of Patent: Oct. 13, 2015

(54) HALF-TONE PHASE SHIFT MASK BLANK AND METHOD FOR MANUFACTURING HALF-TONE PHASE SHIFT MASK

(71) Applicant: Shin-Etsu Chemical Co., Ltd., Chiyoda-ku (JP)

(72) Inventors: Souichi Fukaya, Niigata (JP); Hideo Nakagawa, Niigata (JP); Kouhei Sasamoto, Niigata (JP)

(73) Assignee: SHIN-ETSU CHEMICAL CO., LTD., Chiyoda-ku (JP)

( * ) Notice: Subject to any disclaimer, the term of this patent is extended or adjusted under 35 U.S.C. 154(b) by 228 days.

(21) Appl. No.: 13/892,496

(22) Filed: May 13, 2013

(65) Prior Publication Data

US 2013/0309598 A1    Nov. 21, 2013

(30) Foreign Application Priority Data

May 16, 2012    (JP) ................. 2012-112512

(51) Int. Cl.
*G03F 1/32*    (2012.01)
*G03F 1/29*    (2012.01)
(Continued)

(52) U.S. Cl.
CPC .. *G03F 1/32* (2013.01); *G03F 1/29* (2013.01); *G03F 1/54* (2013.01); *G03F 1/80* (2013.01)

(58) Field of Classification Search
CPC ..................................... G03F 1/26; G03F 1/32
USPC .............................. 430/5, 322, 323
See application file for complete search history.

(56) References Cited

U.S. PATENT DOCUMENTS

| 5,474,864 | A | 12/1995 | Isao et al. |
| 2003/0013023 | A1* | 1/2003 | Chan ................................. 430/5 |
| 2004/0058252 | A1 | 3/2004 | Mathuni et al. |

(Continued)

FOREIGN PATENT DOCUMENTS

| JP | 61-138257 | 6/1986 |
| JP | 7-140635 | 6/1995 |

(Continued)

OTHER PUBLICATIONS

Extended European Search Report issued Sep. 6, 2013 in Patent Application No. 13167563.9.

(Continued)

*Primary Examiner* — Stephen Rosasco
(74) *Attorney, Agent, or Firm* — Oblon, McClelland, Maier & Neustadt, L.L.P.

(57) ABSTRACT

A half-tone phase shift film 2 and a light-shielding film 3 are stacked on transparent substrate 1. The light-shielding film 3 has a monolayer structure or a multilayer structure. At least one layer is formed by film-formation with a chromium-containing material including tin. The half-tone phase shift film 2 is made of a molybdenum silicon nitride oxide. The layer made of a chromium-containing material including tin can cause a significant increase in the etching rate at the time of chlorine-containing dry-etching including oxygen. Thus, burden on the resist pattern or hard mask pattern at the time of transferring a pattern on the light-shielding film is reduced, and therefore it is possible to carry out pattern transfer with high precision. The present invention provides a novel technique that can increase a dry-etching rate of a light-shielding film made of a chromium-containing material while assuring various characteristics required for the light-shielding film.

9 Claims, 5 Drawing Sheets

(51) Int. Cl.
  *G03F 1/54* (2012.01)
  *G03F 1/80* (2012.01)

(56) References Cited

U.S. PATENT DOCUMENTS

| | | |
|---|---|---|
| 2007/0128528 A1* | 6/2007 | Hess et al. ................ 430/5 |
| 2008/0063950 A1 | 3/2008 | Yoshikawa et al. |
| 2010/0173234 A1 | 7/2010 | Okubo et al. |

FOREIGN PATENT DOCUMENTS

| | | |
|---|---|---|
| JP | 7-281414 | 10/1995 |
| JP | 2003-322948 A | 11/2003 |
| JP | 2004-336066 A | 11/2004 |
| JP | 2006-48033 A | 2/2006 |
| JP | 2006-78807 | 3/2006 |
| JP | 2006-146151 | 6/2006 |
| JP | 2007-33469 | 2/2007 |
| JP | 2007-504497 A | 3/2007 |
| JP | 2008-304942 A | 12/2008 |
| JP | 2009-80510 | 4/2009 |
| JP | 2011-164598 A | 8/2011 |
| WO | WO 2007/074806 A1 | 7/2007 |
| WO | WO 2012/043695 A1 | 4/2012 |
| WO | WO 2012/070209 A1 | 5/2012 |

OTHER PUBLICATIONS

Decision to Grant issued Apr. 7, 2015 in Japanese Patent Application No. 2012-112512.

* cited by examiner

HALF-TONE PHASE SHIFT MASK BLANK AND METHOD FOR MANUFACTURING HALF-TONE PHASE SHIFT MASK

CROSS REFERENCE TO RELATED APPLICATION

The present application claims the benefit of the filing date of Japanese application no. 2012-112512, filed on May 16, 2012.

TECHNICAL FIELD

The present invention relates to a photomask blank for a photomask used in manufacture of a semiconductor integrated circuit or the like. More specifically, the present invention relates to a half-tone phase shift mask blank having a light-shielding film and a method for manufacturing a half-tone phase shift mask using such a mask blank.

BACKGROUND ART

In the field of semiconductor technology, research and development for further refinement of patterns have been progressed. In recent years, particularly, with high integration of a large scale integration circuit, refinement of circuit patterns, wiring patterns, or contact-hole patterns for wiring between layers forming a cell has been progressed, and a request for microfabrication technology has been increased.

In connection with this, even in the field of technology for photomask production to be used in the process for photolithography in microfabrication, a technique for forming fine and correct circuit patterns (mask patterns) has begun to be demanded.

Generally, reduction projection is performed when forming a pattern on a semiconductor substrate by photolithographic technique. The size of the pattern formed on the photomask is therefore approximately four times larger than the size of the pattern formed on the semiconductor substrate. However, this does not mean that the desired precision of the pattern formed on the photomask is smaller than the pattern formed on the semiconductor substrate. Rather, the precision of a pattern formed on the photomask as a master is desired to be higher than an actual pattern obtained after exposure.

In today's photolithography technical field, the size of a circuit pattern to be drawn is considerably smaller than the wavelength of light to be used for exposure. Thus, in the case of forming a photomask pattern with a just four-times larger circuit pattern, light interference or the like, which is generated under exposure, influences the transfer of an original shape. As a result, the original shape cannot be transferred onto the resist film of a semiconductor substrate.

In some cases, therefore, a pattern formed on the photomask is made more complicated than an actual circuit pattern to reduce an effect of the above light interference or the like. The shape of such a pattern may be, for example, an actual circuit pattern subjected to optical proximity correction (OPC).

Hence, along with a decrease in size of a circuit pattern, a higher precision processing technique has been also desired in a lithographic technique for forming photomask patterns. Although lithography performance may be expressed in limiting resolution, a pattern formed on a photomask as a master desires higher precision than an actual pattern formed after exposure as described above. Thus, limiting resolution required for formation of a photomask pattern is almost equal to or higher than one required in lithography for forming a pattern on a semiconductor base.

In general, when forming a photomask pattern, a resist film is formed on the surface of the photomask blank in which a light-shielding film is mounted on a transparent substrate, and a pattern is then drawn (exposed) on the resist film by an electron beam. Subsequently, after obtaining a resist pattern after developing the exposed resist film, the light-shielding film is etched by using this resist pattern as a mask to obtain a light-shielding (film) pattern. The light-shielding (film) pattern thus obtained is served as a photomask pattern.

In this case, the above resist film should be thinned depending on the degree of fineness of the light-shielding pattern. This is because, when forming a fine light-shielding pattern while keeping the thickness of the resist film, the ratio (aspect ratio) of the thickness of the resist film to the size of the light-shielding pattern becomes large and causes troubles of failed pattern transfer, falling down or peeling off of the resist pattern, or the like due to deterioration of the shape of the resist pattern.

As a material of the light-shielding film mounted on the transparent substrate, many kinds of materials have so far been proposed. Among them, however, a chromium compound has been practically used because of much know-how on etching, for example.

Dry etching of a chromium-containing material film is generally performed by chlorine-containing dry etching. In many cases, however, chlorine-containing dry etching has a certain level of ability to etch an organic layer. Thus, in the case that a resist pattern is formed on a thin resist film and then used as a mask to etch a light-shielding film, the resist pattern is also etched too much to ignore by chlorine-containing dry etching. As a result, the proper resist pattern, which should be transferred to a light-shield film, cannot be correctly transferred to the light-shielding film.

In order to avoid such inconvenience, a resist material having excellent etching resistance has been requested. However, such a resist material has not been known yet. For this reason, to obtain a light-shielding (film) pattern having high resolution property, a light-shielding film material having higher processing accuracy is required.

For a light-shielding film having higher processing accuracy as compared with a conventional material, there is a report of an attempt to increase the etching rate of a light-shielding film by allowing a chromium compound to contain only a certain amount of a light element.

For example, Patent Literature 1 (WO 2007/74806 A) discloses a technique for reducing resist film loss at the time of chlorine-containing dry etching by using a material mainly containing chromium (Cr) and nitrogen (N) and having an X-diffraction peak of substantially CrN(200) as a light-shielding film material to enhance a dry-etching rate.

Patent Literature 2 (JP 2007-33469 A) discloses the invention of a photomask blank where the composition, film thickness, and laminated structure thereof are suitably designed to obtain desired transmittance T and reflectance R while attaining an increase in the rate of dry-etching by providing the light element with rich content of a light element and low content of chromium.

CITATION LIST

Patent Literatures

Patent Literature 1: WO 2007/74806 A
Patent Literature 2: JP 2007-33469 A
Patent Literature 3: JP 7-140635 A Patent Literature 4: JP 7-281414 A
Patent Literature 5: JP 61-138257 A
Patent Literature 6: JP 2009-80510 A
Patent Literature 7: JP 2006-146151 A
Patent Document 8: JP 2006-78807 A

SUMMARY OF THE INVENTION

Technical Program

However, the technique as described above, where a light element is added to a chromium-containing compound to suppress a decrease in thickness of a resist film by increasing the dry-etching rate of a light-shielding film, has the following disadvantage:

When using a light-shielding film material in which a light element is added to a chromium-based compound, the light-shielding film should not only ensure its improved etching rate but also ensure predetermined optical containing characteristics because the light-shielding film is also served as an optical film. However, the flexibility of the film design enough to simultaneously satisfy both demands is not always high.

For example, a decrease in optical density cannot be completely avoided when the addition of a light element is performed to enhance an etching rate. In fact, therefore, the film should be thickened. In this case, even though the etching rate of the light-shielding film itself increases, the etching time is prolonged as the film thickness increases. Thus, an effect is unwillingly limited in view of shortening the total etching time.

Incidentally, a photomask blank used in manufacture of a half-tone phase shift mask is one prepared by forming a half-tone phase shift film on a transparent substrate using a material containing a transition metal and silicon as well as nitrogen or oxygen as a light element (Patent Literature 3: JP 7-140635 A) or a material containing nitrogen or oxygen as a light element in tantalum (Patent Literature 4: JP 7-281414 A), and then forming a light-shielding film made of a chromium-containing material on the film (see, for example, Patent Reference 2).

Generally, a film made of a material containing a transition metal and silicon as well as nitrogen or oxygen as a light element or a material containing nitrogen or oxygen as a light element in tantalum can be processed by fluorine-containing dry etching. On the other hand, a chromium-containing material shows high resistance against fluorine-containing dry etching. Thus, if a resist pattern is transferred to a light-shielding film made of a chromium-containing material, the light-shielding film can be used for transferring a pattern to the half-tone phase shift film made of the above material with high precision.

Furthermore, there is a need of removing the unnecessary portion of the light-shielding film made of a chromium-containing material, which remains on the high-precision half-tone phase shift pattern produced as described above. The removal of such a portion is performed by chlorine-containing dry-etching including oxygen. Since the above half-tone phase shift film material has a certain degree of etching resistance against the chlorine-containing dry-etching including oxygen, the damage to the half-tone phase shift film can be suppressed as low as possible even if the etching of the light-shielding film is performed under the above dry-etching conditions.

In view of request for further miniaturization and high-precision of lithography technology for formation of photomask pattern in recent years, an improvement on the conventional procedure has its own limitations because the accuracy of resist pattern transfer to the light-shielding film made of a chromium-containing material is insufficient.

As a method for processing a chromium-containing film with high precision, there is a known method in which a hard mask film made of a silicon-containing material is used as a process auxiliary film (see, for example, Patent Literature 5: JP 61-138257 A and Patent Literature 6 2009-80510 A). However, since the etching resistance of the silicon-containing material against chlorine-containing dry-etching including oxygen is not sufficiently high, the hard mask film made of a silicon-containing material cannot be sufficiently thinned. When the hard mask film, which cannot be easily thinned, is used as a processing auxiliary film, under present circumstances, there is a limit on high-precision of pattern transfer because of burden or the like on the resist pattern at the time of patterning.

Hence, in order to provide a half-tone phase shift mask blank in response to the request for further miniaturization and high-precision of lithography technology for formation of photomask pattern in recent years, there is a need of applying a procedure, which is different from the conventional one, for improving the etching rate of the light-shielding film made of a chromium-containing material formed on the half-tone phase shift film processed by fluorine-containing dry etching.

The present invention has been made in consideration of the aforementioned problem and its object resides in providing a novel technique that can increase a dry-etching rate of a light-shielding film made of a chromium-containing material while assuring various characteristics, such as optical and chemical characteristics, required for the light-shielding film.

Solution to Problem

To solve the aforementioned problems, the half-tone phase shift mask blank according to the present invention includes a light-shielding film having a monolayer structure or a multi-layer structure. The light-shielding film is provided on the half-tone phase shifting layer and includes at least one of layers made of a chromium-containing material. The at least one of the layers made of a chromium-containing material is made of a chromium-containing material including tin.

Preferably, the chromium-containing material including tin has a content of tin of not under 0.01 times and not over 2 times than the content of chromium in atomic ratio.

Preferably, furthermore, all the layers of the light-shielding film are made of a chromium-containing material.

Preferably, the chromium-containing material is any one of a chromium metal, chromium oxide, chromium nitride, chromium carbide, chromium oxide nitride, chromium oxide carbide, chromium nitride carbide, and chromium oxide nitride carbide, The chromium-containing material including tin is any one of a tin-chromium metal, tin-chromium oxide, tin-chromium nitride, tin-chromium carbide, tin-chromium oxide nitride, tin-chromium oxide carbide, tin-chromium nitride carbide, and tin-chromium oxide nitride carbide.

It is preferred that the half-tone phase shifting layer be made of a material etchable with fluorine-containing dry etching.

Preferably, furthermore, the material etchable with fluorine-containing dry etching is a silicon-containing material including a transition metal.

Preferably, the silicon-containing material contains molybdenum and silicon, and further contains at least one of nitrogen and oxygen as a light element.

Preferably, furthermore, a hard mask film on the light-shielding film, where the hard mask film has etching resistance to chlorine-containing dry-etching including oxygen.

Preferably, the hard mask film contains silicon, and further contains at least one of nitrogen and oxygen as a light element.

The method for manufacturing a haft-tone phase shift mask according to the present invention includes the steps of: subjecting the layer made of the chromium-containing material including tin to an etching process with chlorine-containing dry-etching including oxygen using the above half-tone phase shift mask blank; and subjecting the half-tone phase shifting layer to an etching process with fluorine-containing dry etching.

Advantageous Effects of Invention

In the present invention, a light-shielding film formed on a half-tone phase shift mask blank is configured as one having a monolayer structure or a multilayer structure, at least one of the layers is a layer made of a chromium-containing material, and at least one of the layers made of a chromium-containing material is made of a chromium-containing material including tin. The layer made of a chromium-containing material including tin can cause a significant increase in the etching rate at the time of chlorine-containing dry-etching including oxygen without a decrease in light-shielding property.

Thus, burden on the resist pattern or hard mask pattern at the time of transferring a pattern on the light-shielding film is reduced, and therefore it is possible to carry out pattern transfer with high precision. Therefore, since the pattern transfer to the light-shielding film results in high precision patterning, the pattern transfer to the half-tone phase shift film can also result in high precision patterning.

DESCRIPTION OF EMBODIMENTS

Figure 1:
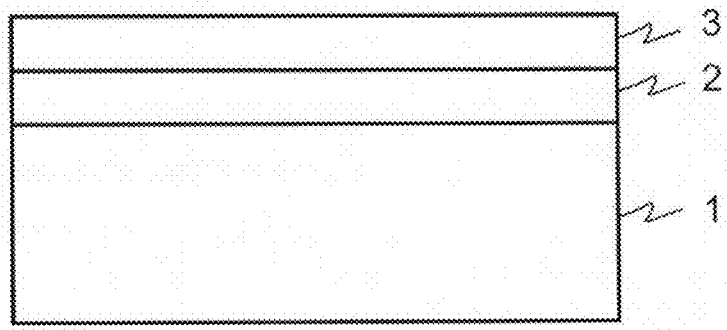
FIG. 1 is a cross-sectional diagram illustrating the configuration of a half-tone phase shift mask blank according to an embodiment of the present invention.

Hereinafter, an embodiment of the present invention will be described with reference to drawings.

The term "light-shielding film" may refer to a film having a function of absorbing exposure light in distinction from the term "anti-reflection film" that prevents reflection of light. In this specification, unless otherwise noted, the term "light-shielding film" is used as one that includes the meanings of both terms "light-shielding film" and "anti-reflection film" as mentioned above. In the case that there is a need of distinguishing the term "light-shielding film" and "anti-reflection film" from each other with respect to the above meanings, the term "light-shielding film" responsible for function of absorbing exposure light is referred to as an "light-shielding layer" and the term "anti-reflection film" mainly responsible for function of preventing reflection is referred to as an anti-reflection layer.

As described above, in order to provide a half-tone phase shift mask blank in response to the request for further miniaturization and high-precision of lithography technology for formation of photomask pattern in recent years, there is a need of applying a procedure, which is different from the convention one, for improving the etching rate of the light-shielding film made of a chromium-containing material formed on the half-tone phase shift film processed by fluorine-containing dry etching.

As a result of investigating an increase in dry-etching rate of a chromium-containing material as a light-shielding film material, the present inventors have completed the present invention by finding out that the dry-etching rate of chlorine-containing dry-etching including oxygen can be significantly increased without a decrease in light blocking effect by including tin into the chromium-containing material.

The half-tone phase shift mask blank according to the present invention is one prepared by modifying a publicly known half-tone phase shift film blank having a light-shielding film having a single layer structure or a multilayer structure, where at least one layer made of a chromium-containing material contains tin.

The half-tone phase shift mask blank having a structure in which a light-shielding film is formed using a layer made of a chromium material is publicly known. For example, Patent Literature 2 discloses a structure in which all the layers of a light-shielding film are made of a chromium-containing material. Furthermore, a structure in which part of a light-shielding film is provided as a layer made of a chromium-containing material (see, for example, Patent Literature 7: JP 2006-146151 A and Patent Literature 8: JP 2006-78807 A). An improvement of the light-shielding film of the present invention is applicable to any of these structures.

In other words, the half-tone phase shift mask blank of the present invention includes a light-shielding film having a monolayer structure or a multilayer structure provided on the half-tone phase shifting layer. The light-shielding film includes at least one of layers made of a chromium-containing material, and at least one of the layers made of a chromium-containing material is made of a chromium-containing material including tin.

First, the chromium-containing material including tin will be described.

Since a chromium-containing material has comparatively good chemical stability, it has been widely used as an optical film material, especially a light-shielding film material. Since the chromium-containing material has a high resistance against fluorine-containing etching gas, it can be safely used as an etching mask for patterning a silicon-containing material with fluorine-containing dry etching.

For patterning a chromium-containing material film, chlorine-based dry etching is commonly performed. However, chlorine-containing dry-etching including oxygen etches a photoresist used for patterning too much to ignore. Thus, there is a limit to make a resist film thin. However, the formation of a fine pattern on the photoresist becomes difficult as the resist film is made thicker. In other words, a measurable film loss of the resist film due to the chlorine-containing dry-etching including oxygen makes it difficult to pattern a chromium-containing material film in high precision.

In consideration of such a problem, there is a publicly known method for pattern formation in which a hard mask is formed on a chromium-containing material film and the film is then processed by chlorine-containing dry-etching including oxygen. According to this method, the problem of the film loss of the resist film due to chlorine-containing dry-etching including oxygen can be solved.

Examples of the material of such a hard mask include silicon-containing materials which can be etched with fluorine-containing dry etching and show etching resistance against chlorine-containing dry-etching including oxygen (see, for example, Patent Literature 5). In addition, a material containing oxygen or nitrogen in silicon, a material further containing carbon in such a material, a material containing a transition metal and oxygen or nitrogen in silicon, a material further containing carbon in such a material, and the like are also known (see, for example, Patent Literature 6).

In a method using such a hard mask, first, a hard mask pattern is obtained by transferring a resist pattern on a hard mask film by fluorine-containing dry etching, and a pattern formation is then performed on a chromium-containing material film by chlorine-containing dry-etching including oxygen using such a hard mask pattern.

The use of such a hard mask technology, the problem of burden on the resist pattern at the time of etching the chromium-containing material film. However, since the etching resistance of the above hard mask material against the chlorine-containing dry-etching including oxygen is not necessarily enough, there is a limit to make the hard mask into a thin film. In particular, under present circumstances, it is difficult to make an exposure photomask for a circuit having a fine pattern of 20 nm in minimum line width by using the hard mask technology.

Thus, it has been desired to replace the conventional method with a novel method for etching a chromium-containing material film while reducing its burden to a mask pattern.

In the case of forming a chromium-containing material film by sputtering, a high-purity chromium target which is free of any metal impurity is commonly used. In general, this is due to the reasons such as an empirically known fact that a decrease in etching rate of the chromium-containing material film occurs when a metal impurity is mixed into a chromium-containing material film formed by sputtering.

The present inventors have repeatedly performed various examinations on a novel procedure for increasing the dry-etching rate of a film made of a chromium-containing material while assuring design flexibility of the film. As a result, the present inventors have completed the present invention by finding out that, when tin is included in the chromium-containing material film, an increase in etching rate occurs at the time of carrying out chlorine-containing dry-etching including oxygen.

In other words, conventionally, film formation of a chromium-containing material film is performed to avoid contamination of metal impurities in the film by using a high-purity chromium target so that the etching rate of the chromium-containing material film is prevented from decreasing. In contrast, based on the above new finding, film formation is performed so that tin is intentionally added to a chromium-containing material film.

According to the investigation of the present inventors, the content (concentration) of tin in a chromium-containing material film is preferably not under 0.01 times, more preferably not under 0.1 times, further preferably not under 0.3 times than the content of chromium in atomic ratio.

A chromium-containing material film where the content of tin is not under 0.01 times than that of chromium in atomic ratio has a significantly increased etching rate under general conditions for chlorine-containing dry-etching including oxygen. This effect becomes large as the content of tin increases. The upper limit of the content of tin is not particularly limited. However, an excess content of tin may lead to a difficulty in obtaining a film having substantially the same characteristics as those of a tin-free chromium-containing material. Thus, the content of tin is preferably not over 2 times than that of chromium in atomic ratio, more preferably not over 1.5 times than that of chromium in atomic ratio.

At least one layer of layer made of a chromium-containing materials are included, and the tin of above-mentioned concentration contains the light-shielding film having a monolayer structure or a multilayer structure concerning the present invention in at least one layer in a layer made of a chromium-containing material. Tin at the above concentration is included in at least one of the layers made of a chromium-containing material. That is, there is no need of including tin at the above concentration in all of the layers made of a chromium-containing material, which form a light-shielding film. In practice, however, it is preferred to contain tin at the above concentration in the layers corresponding to 50% or higher of the total layer thickness of the layers made of a chromium-containing material, which form a light-shielding film.

The value is more preferably 75% or higher. Needless to say, all the layers of the light-shielding film in a multiple layer structure may be made of a chromium-containing material, and all the layers may contain tin at the above concentration.

The chromium-containing material layers containing tin may be equal in content ratio of tin to chromium, or may be different from one another with respect to a content ratio of tin to chromium. The tin contained in each layer of the light-shielding film does not need to be uniformly distributed in each layer, and may have a profile which has a concentration change in the thickness direction (depth direction) of a layer.

For example, if the upper layer is designed to be a tin-free layer or a layer having a low tin content ratio and the lower layer is designed to be a layer having a high tin content ratio, only the etching rate of the lower layer (on the substrate side) can be increased in contrast to the etching rate of the upper layer (on the surface side). Thus, an over etching time can be set short. On the other hand, when the light-shielding film is designed so that the tin content ratio is lower at the substrate side, it is possible to easily detect the end by monitoring of chromium at the time of dry-etching.

More specifically, for example, in the case that all the layers of the light-shielding film of the present invention are chromium-containing material layers, the content of tin may be not under 0.01 times than the content of chromium in the entire thickness of the light-shielding film. Alternatively, for example, the following variations are applicable: The content of tin in a layer prepared with emphasis on reflection-preventing function may be different from one prepared with emphasis on light-shielding function; only the layer may prepared with emphasis on reflection-preventing function have the content of tin not under 0.01 times than the content of chromium; or in contrast, only the layer may prepared with emphasis on light-shielding function reflection-preventing function have the content of tin not under 0.01 times than the content of chromium.

The above chromium-containing material including tin is any one of chromium compounds, such as a tin-chromium metal, tin-chromium oxide, tin-chromium nitride, tin-chromium carbide, tin-chromium oxide nitride, tin-chromium oxide carbide, tin-chromium nitride carbide, and tin-chromium oxide nitride carbide. Among them, tin-chromium nitride, tin-chromium oxide nitride, and tin-chromium oxide nitride carbide are particularly preferred.

Examples of a tin-free chromium-containing material include a chromium metal and chromium compounds such as chromium oxide, chromium nitride, chromium carbide, chromium oxide nitride, chromium oxide carbide, chromium nitride carbide, and chromium oxide nitride carbide. Among them, chromium nitride, chromium oxide nitride, and chromium oxide nitride carbide are particularly preferred.

Although the chromium-containing material layer containing tin of the present invention can be formed according to a publicly known method for forming a typical chromium-containing material layer (see, for example, Patent Literatures 1, 2, 4, 7, and 8), a film excellent in uniformity can be easily obtained using a sputtering method such as DC sputtering or RF sputtering.

When carrying out sputtering film formation of the chromium-containing material layer containing tin of the present invention, a chromium target added with tin (tin-added chromium target) may be used. The chromium target and the tin target may be independently provided to carry out co-sputtering (simultaneous sputtering). Alternatively, a complex target having a chromium region and a tin region in a single target may be used. Furthermore, co-sputtering may be performed using both the above complex target and the chromium target.

In the case of adding tin to the chromium target, it may be added as a metal tin or may be added as a tin compound such as tin oxide, tin nitride, or ITO.

In the case of carrying out co-sputtering using both a tin-containing target and a tin-free target, the concentration of tin in an inorganic material film can be adjusted no only by controlling the surface area ratios of the respective targets but also by controlling electric power to be applied to each target.

Particularly, if there is a need of changing the ratio of chromium between the chromium-containing material including tin layers or a need of gradual change in ratio of chromium to tin in a single layer, co-sputtering is performed using a combination of a tin-containing target and a tin-free target or a combination of targets with different tin contents to change an applied power ratio between the targets. As a result, layers with different desired tin content ratios can be formed.

The sputtering gas used in film formation of the light-shielding film of the present invention is suitably selected according to the composition of the film. In order to adjust an optical concentration, the use of reactive sputtering with sputtering gas and the addition of one or more elements selected from oxygen, nitrogen, and carbon are performed just as in the case with the film-formation of a publicly known chromium-containing material layer.

For example, only argon gas may be used when the film-formation of a tin-containing inorganic material film that does not contain a light element is performed. In the case of film-formation of an inorganic material film containing a light element, reactive sputtering may be performed in one or more kinds of reactive gas, such as nitrogen gas, nitrogen oxide gas, oxygen gas, carbon oxide gas, hydrocarbon gas, or mixture gas of any of those reactive gas and inert gas such as argon.

Furthermore, in the case of designing a light-shielding film having a chromium-containing material layer containing tin, the amount of a light element added may be found within in the range used for designing a publicly known chromium-containing material layer.

The flow rate of sputtering gas is adjusted suitably. The gas flow rate may be constant in the process of film-formation. Alternatively, the gas flow rate may be changed according to the target composition when there is a need of changing the amount of oxygen or the amount of nitrogen in a thickness direction.

The above layer made of a chromium-containing material including tin may be substantially applicable without modification to a publicly known light-shielding film having a structure including a layer made of a chromium-containing material as a structural element formed on a half-tone phase shift film.

In this case, the chromium-containing material layer of the publicly known light-shielding film having a multiple layer structure may be replaced with the above chromium-containing material layer of the present invention. All the layers of the light-shielding film may be replaced with the chromium-containing material layer.

Hereinafter, the design of the light-shielding film of the present invention will be briefly described.

A light-shielding film provided on a half-tone phase shift film can be used for providing a complete light-shielding portion of a tri-tone mask using a half-tone film with comparatively high transmittance, a light-shielding portion (light-shielding frame) for preventing light leakage from a region where overlap exposure is occurred between shots when exposure is performed several times on a substrate provided as a processing target, or the like.

Such a light-shielding portion is requested to have a function substantially blocking exposure light passing through both the light-shielding film and the half-tone phase shift film. Thus, in general, materials and film thickness are designed so that the optical density thereof against the exposure light can be a predetermined value when used as a mask. Furthermore, the above optical density is preferably 2.5 or higher.

In the case of providing a layer having reflection-preventing function on the surface side of a light-shielding film (i.e., on the surface opposite to the surface brought into contact with a half-tone phase shift film), the optical density and film thickness of a refection-preventing function layer are also designed so as to be desired values. In addition, the reflectance to exposure light is designed so as to be, for example, 35% or lower, preferably 25% or lower.

Such a light-shielding film is provided as a multilayer structure and all the layers of the light-shielding film are made of a chromium-containing material. For example, when the layers made of the above chromium-containing material including tin occupy 50% or higher of the entire thickness of the light-shielding film, the etching rate of the film can be significantly increased under the conditions for chlorine-containing dry-etching including oxygen as compared with a light-shielding film including only layers made of a tin-free chromium-containing material.

Preferably, the layers made of a chromium-containing material including tin make up 75% or higher of the light-shielding film. In particular, when all the layers are those made of a chromium-containing material including tin, an effect of shortening the above etching time can be remarkably achieved. Such an effect of shortening the etching time allows the light-shielding film to reduce damage of a resist pattern to be received in process of etching the light-shielding film. As a result, a high-precision light-shielding film pattern can be obtained.

On the other hand, the etching resistance of the chromium-containing material film containing tin under the conditions for fluorine-containing dry etching is equal to or higher than the etching resistance of the tin-free chromium-containing material.

In the case of pattern formation on a light-shielding film that includes a layer made of a chromium-containing material on the surface side thereof and other layers made of silicon-containing material, such as one disclosed in Patent Literature 8, the chromium-containing material layer containing tin on the upper side is first processed by chlorine-containing dry-etching including oxygen to reduce burden on a resist pattern.

The patterned chromium-containing material layer containing tin is then used as a hard mask to carry out fluorine-containing dry etching of the silicon-containing material layer on the lower side.

The half-tone phase shift film, which is included in the half-tone phase shift mask of the present invention, is not specifically limited as long as it is a film that attains predetermined transmittance and phase difference. However, it is preferred that the film is formed from a material processable with fluorine-containing dry etching. Examples of such a material include a tantalum compound (see, for example, Patent Literature 4) and a silicon-containing material including a transition metal (see, for example, Patent Literatures 3, and 6 to 8), which have been publicly known and practically used.

Examples of the transition metal contained in the silicon-containing material include tungsten, molybdenum, titanium, tantalum, zirconium, hafnium, niobium, vanadium, cobalt, and nickel. Among them, one containing molybdenum is preferred from a viewpoint of processing characteristics.

Examples of the silicon-containing material including molybdenum include molybdenum silicide oxide (MoSiO), a molybdenum silicide nitride (MoSiN), molybdenum silicide carbide (MoSiC), a molybdenum silicide oxide nitride (MoSiON), molybdenum silicide oxide carbide (MoSiOC), molybdenum silicide nitride carbide (MoSiNC), and molybdenum silicide oxide nitride carbide (MoSiONC). Among them, molybdenum silicide nitride carbide (MoSiON) is preferred.

The half-tone phase shift film made of a silicon-containing material including such a transition metal can be formed by a publicly known method. For example, film-formation can be performed by a sputtering method using as a target a silicon target containing a transition metal; a target of silicon alone and a transient metal; and a target of silicon alone and a transient metal target.

sputtering gas used in this case is selected from, for example, inert gas such as neon, argon, and krypton; and, if required, reactive gas containing oxygen, nitrogen, or carbon (such as oxygen gas ($O_2$), nitrogen gas ($N_2$), nitrogen oxide gas (NO, $NO_2$, $N_2O$), carbon oxide gas (CO, $CO_2$), and hydrocarbon gas (for example, methane)). The kind of reactive gas is suitably selected by the composition of the half-tone phase shift film, which is subjected to film-formation.

Generally, a half-tone phase shift film is designed so that a transmittance of exposure light can be 5 to 40%. In general, furthermore, the film thickness of the half-tone phase shift film is designed so that a phase difference of exposure light between a portion where the phase shift film is formed and a portion where the phase shifting layer is not formed can be approximately 180°.

Also in the half-tone phase shift mask blank of the present invention, just as in the case with a photomask blank disclosed in Patent Literature 6, a hard mask film may be provided on the upper side of the light-shielding film, or on the side thereof opposite to the transparent substrate, the hard mask being configured to have etching resistance to chlorine-containing dry-etching including oxygen while being possible to be processed by fluorine-containing dry etching or chlorine-containing dry-etching including oxygen.

Materials for such a hard mask are described in Patent Literature 6 in detail, the materials including, for example, a tantalum compound, a hafnium compound, a silicon-containing material including a transition metal, and a silicon-containing material free of a transition metal. From a view point of processability, a silicon-containing material free of a transition metal or a silicon-containing material including a transition metal are preferred.

Examples of the transition metal contained in the silicon-containing metal include tungsten, molybdenum, titanium, tantalum, zirconium, hafnium, niobium, vanadium, cobalt, and nickel. Among them, one containing molybdenum is preferred from a viewpoint of processing characteristics.

Examples of the silicon-containing material including molybdenum include molybdenum silicide oxide (MoSiO), a molybdenum silicide nitride (MoSiN), molybdenum silicide carbide (MoSiC), a molybdenum silicide oxide nitride (MoSiON), molybdenum silicide oxide carbide (MoSiOC), molybdenum silicide nitride carbide (MoSiNC), and molybdenum silicide oxide nitride carbide (MoSiONC).

Examples of the silicon-containing material free of a transition metal include silicon oxide, silicon nitride, silicon oxide nitride, silicon oxide carbide, silicon carbide nitride, and silicon carbide oxide nitride.

Patent literature 6 illustrates that a light-shielding film made of a chromium-containing material in which all the layers are free of tin is processed using a hard mask film made of a silicon-containing material. The hard mask film is formed comparatively thick as much as a thickness of 90 nm or higher.

Like the present invention, on the other hand, in the case of a light-shielding film including as a structural component a layer made of a chromium-containing material including tin, a hard mask film has an enough thickness of 50 nm or lower, and there is no problem occurred in practice even if he thickness of the hard mask film is 20 nm or lower. Even if it is less than 10 nm or lower, the light-shielding film can be processed.

Furthermore, the lower limit of the thickness of such a hard mask film depends on the transmittance of a half-tone phase shift film and the thickness of a light-shielding film defined by such transmittance. However, if it is lower than 1 nm, sufficient processing accuracy may be not secured.

The configuration of the hard mask film is not restricted to one that can be removed after processing a light-shielding film. As disclosed in Patent Literature 7, a hard mask film may be formed in a light-shielding film that is configured such that a silicon-containing material is provided on the surface side of the light-shielding film and a chromium-containing material is provided on the substrate side thereof.

In this kind of the light-shielding film, the silicon-containing material layer on the surface side thereof is processed by fluorine-containing dry etching. A silicon-containing material pattern thus obtained is used as a hard mask pattern. In other words, the silicon-containing material layer provided as a part of the light-shielding film is also functioned as a "hard mask film". Furthermore, using such a silicon-containing material pattern as a mask, the chromium-containing material layer on the substrate side is processed by chlorine-containing dry-etching including oxygen. At this time, when the chromium-containing material layer contains tin, an etching time can be shortened.

As described above, by employing a chromium-containing material including tin as a light-shielding film or the like, an increase in etching rate at the time of chlorine-containing dry-etching including oxygen can be achieved. In addition, sufficient etching resistance to conditions for fluorine-containing dry etching can be secured. As a result, it becomes processable in high precision.

A process for manufacturing a haft-tone phase shift mask using a half-tone phase shift mask blank including as a structural component a film made of a chromium-containing material is publicly known (see, for example, patent documents 3, 6 to 8). Hereinafter, the respective steps will be briefly described by example.

A layer made of a chromium-containing material including tin can be dry-etched with chlorine gas containing oxygen in a manner similar to a layer made of a chromium-containing material free of tin, and it shows a significantly high etching rate as compared with the layer made of a chromium-containing material free of tin under the same conditions.

Dry-etching on the layer made of a chromium-containing material including tin can be performed, for example, using gas of chlorine gas and oxygen gas at a mixture ratio ($Cl_2$ gas:$O_2$ gas) of 1:2 to 20:1 in terms of volumetric flow rate, and optionally mixed with inert gas such as helium.

When a layer made of a chromium-containing material including tin as an etching mask is used as an etching mask and a film under such a layer is then processed by fluorine-containing dry etching, for example, gas containing fluorine can be used. Examples of the gas containing fluorine include fluorine gas, gas containing carbon and fluorine (such as $CF_4$ and $C_2F_6$), and gas containing sulfur and fluorine (such as $SF_6$). Furthermore, these kinds of gas containing fluorine can be mixed with fluorine-free gas, such as helium, and used. The etching gas may be added with gas of oxygen or the like if required.

Figure 2:
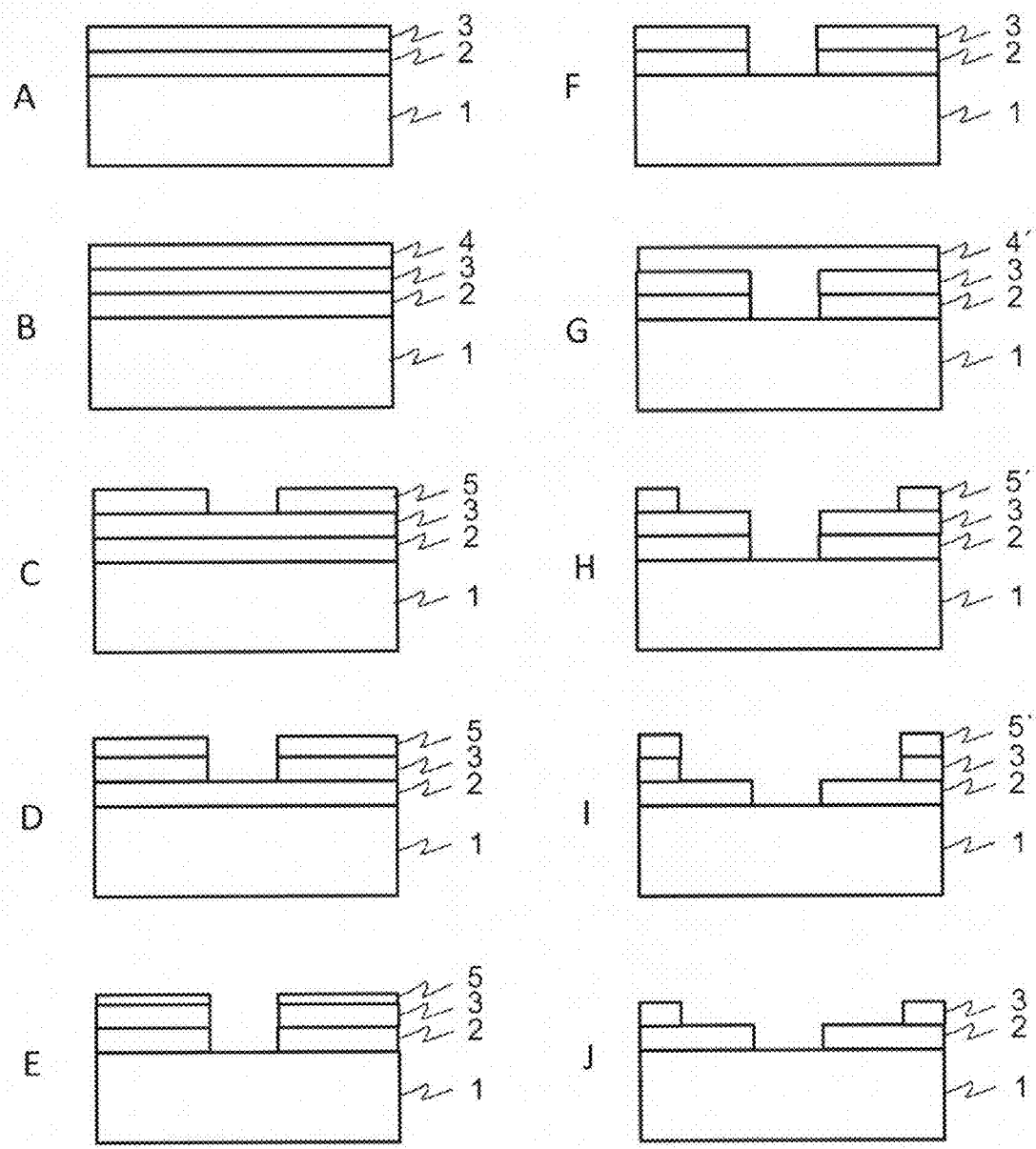
FIG. 2 is a diagram illustrating a process for manufacturing a half-tone phase shift mask according to an embodiment of the present invention.

FIG. 1 is a cross-sectional diagram illustrating the configuration of a half-tone phase shift mask blank according to an embodiment of the present invention. In the embodiment illustrated in the figure, a half-tone phase shift film 2 and a light-shielding film 3 are stacked on transparent substrate 1. The whole light-shielding film 3 is formed by film-formation with a chromium-containing material including tin. The half-tone phase shift film 2 is made of a molybdenum silicon nitride oxide. A process for manufacturing a half-tone phase shift mask using such a blank can be outlined as follows:

FIG. 2 is a diagram illustrating a process for manufacturing a half-tone phase shift mask according to an embodiment of the present invention. First, to the light-shielding film 3 of the half-tone phase shift mask blank (FIG. 2A) illustrated in the FIG. 1, application of a photoresist is performed to form a resist film 4 (FIG. 2B).

Next, in order to carry out patterning to obtain a resist pattern for to carry out patterning for protecting the portion of the half-tone phase shift film 2 to leave it untouched, electron beams are irradiated in pattern on the resist film 4. After subsequent steps of development and so on, a resist pattern 5 is obtained (FIG. 2C).

Using this resist pattern 5 as a mask, the light-shielding film 3 is patterned by chlorine-containing dry-etching including oxygen (FIG. 2D). At this time, the light-shielding film 3 made of a chromium-containing material including tin has a high etching rate. Thus, an etching time is shortened to reduce damage of the resist pattern 5. As a result, it is high-precision pattern transfer can be performed.

Subsequently, using the patterned light-shielding film 3 as a mask, the half-tone phase shift film 2 is processed by fluorine-containing dry etching. The dry etching leads to film loss of the resist pattern 5. However, since the resistance of the light-shielding film 3 made of the chromium-containing material including tin, pattern of the half-tone phase shift film 2 precisely reproducing a designed pattern can be obtained (FIG. 2E).

The remaining resist pattern 5 is removed by dry etching (FIG. 2F), and additional photoresist is then applied, thereby forming a resist film 4' (FIG. 2G).

The resist film 4' is subjected to pattern irradiation of electron beams, and then subjected to predetermined steps of development and so on. As a result, a resist pattern 5' is obtained (FIG. 2H).

Using this resist pattern 5' as a mask, the light-shielding film 3 is patterned by chlorine-containing dry-etching including oxygen (FIG. 2I).

The remaining resist pattern 5' is removed by dry etching. As a result, a half-tone phase shift mask is completed (FIG. 2J).

Figure 3:
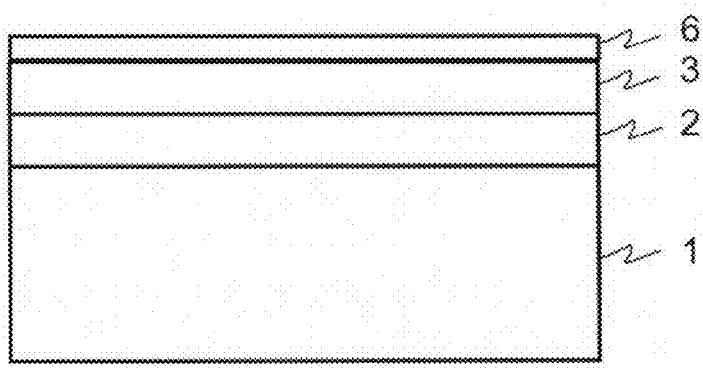
FIG. 3 is a cross-sectional diagram illustrating the configuration of a half-tone phase shift mask blank according to another embodiment of the present invention.

FIG. 3 is a cross-sectional diagram illustrating the configuration of a half-tone phase shift mask blank according to another embodiment of the present invention. In the embodiment illustrated in the figure, a half-tone phase shift film 2 and a light-shielding film 3 are stacked on transparent substrate 1. The whole light-shielding film 3 is formed by film-formation with a chromium-containing material including tin.

On the light-shielding film 3, a hard mask film 6 for etching a chromium-containing material is formed. This hard mask film 6 is a film that can be etched under the conditions for fluorine-containing dry etching and resist etching with chlorine-containing dry-etching including oxygen. For example, the hard mask film 6 contains silicon and further containing at least one of nitrogen and oxygen as a light element. An example of such a material is a silicon oxide. In this embodiment, the half-tone phase shift film 2 is made of a molybdenum silicon nitride oxide. A process for manufacturing a half-tone phase shift mask using such a blank can be outlined as described below.

Figure 4:
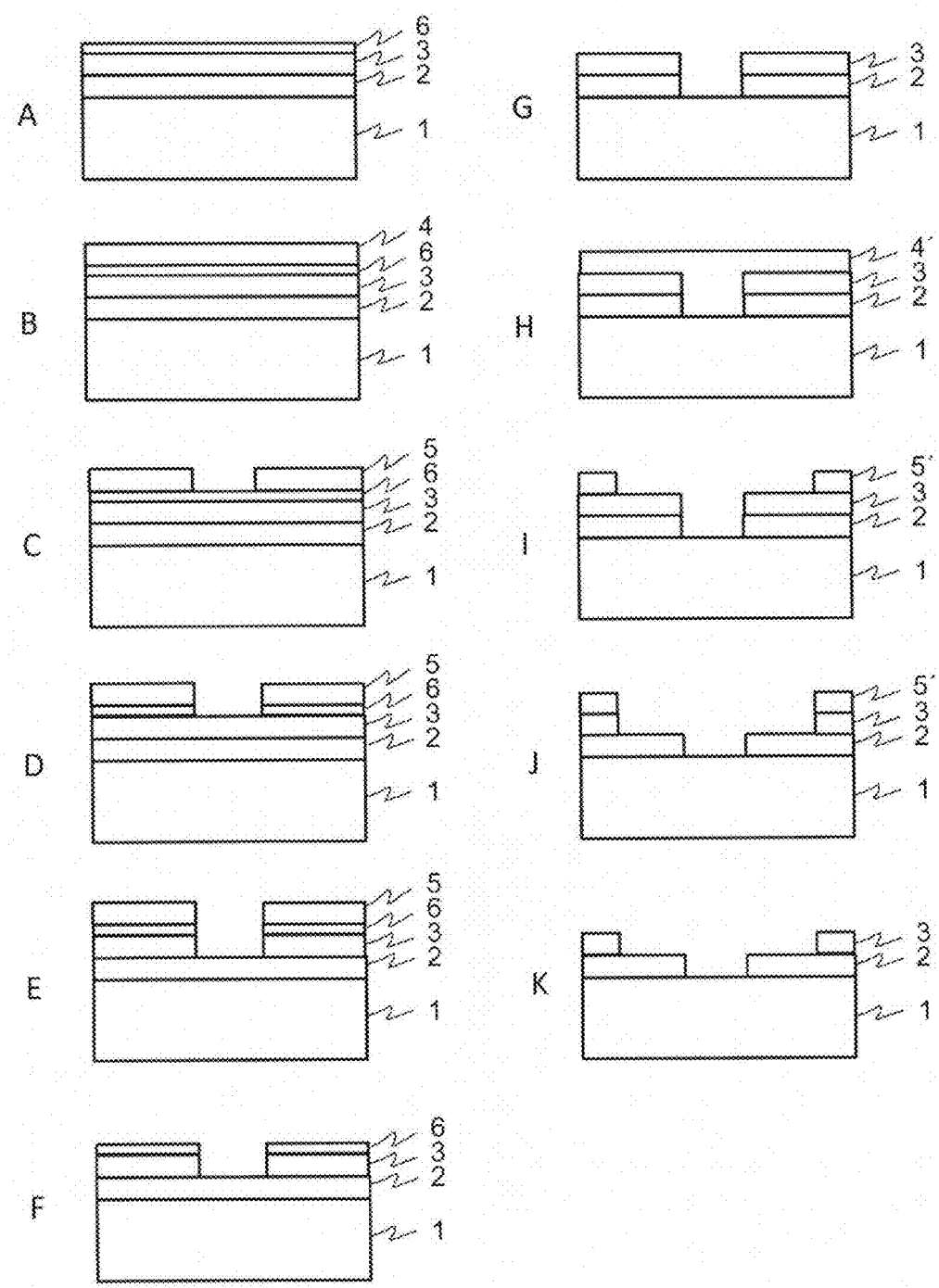
FIG. 4 is a diagram illustrating a process for manufacturing the half-tone phase shift mask.

FIG. 4 is a diagram illustrating a process for manufacturing the half-tone phase shift mask. First, to the hard mask film 6 of the half-tone phase shift mask blank (FIG. 4A) illustrated in the FIG. 3, application of a photoresist is performed to form a resist film 4 (FIG. 4B).

Next, in order to carry out patterning to obtain a resist pattern for to carry out patterning for protecting the portion of the hard mask film 6 to leave it untouched, electron beams are irradiated in pattern on the resist film 4. After subsequent steps of development and so on, a resist pattern 5 is obtained (FIG. 4C).

Using this resist pattern 5 as a mask, the hard mask film 6 is patterned by fluorine-containing dry etching (FIG. 4D). At this time, a high etching rate is obtained at the time of carrying out chlorine-containing dry-etching including oxygen on the light-shielding film 3 made of a chromium-containing material including tin. Thus, the thickness of the hard mask film 6 can be made thin as compared with the conventional one. As a result, high-precision pattern transfer becomes possible.

Subsequently, using the patterned hard mask film 6 as a mask, the light-shielding film 3 is patterned by chlorine-containing dry-etching including oxygen (FIG. 4E).

The remaining resist pattern 5 is removed by dry etching (FIG. 4F).

Next, fluorine-containing dry etching is performed using the patterned light-shielding film 3 as a mask, allowing the light-shielding film pattern to be transferred by the half-tone phase shift film 2. A half-tone phase shift pattern can be obtained substantially as designed (FIG. 4G). The hard mask film 6 on the light-shielding film 3 is also removed by this dry etching.

Application of additive photoresist is performed to form a resist film 4' (FIG. 4H). The resist film 4' is subjected to pattern irradiation of electron beams, and the subjected to predetermined steps of development and so on. As a result, a resist pattern 5' is obtained (FIG. 4I).

Using this resist pattern 5' as a mask, the light-shielding film 3 is patterned by chlorine-containing dry-etching including oxygen (FIG. 4J).

The remaining resist pattern 5' is removed by dry etching, and a half-tone phase shift mask is completed (FIG. 4K).

[Evaluation Experiment Dry-Etching Characteristics]

As an example of an experiment for evaluating dry-etching characteristics, film formation was performed on a square-shaped quartz substrate of 152 mm on a side and 6 mm in thickness by a DC sputtering method using co-sputtering with a chromium target and a tin target which were independently disposed to obtain two different 44-nm thick CrON films with different tin concentration.

The content of tin in the CrON film was adjusted by adjusting power individually applied to the chromium target and the tin target. Sputtering gas was a gas mixture of argon gas, oxygen gas, and nitrogen gas.

For comparison, furthermore, a tin-free CrON film was also formed using a Cr target.

Two or more of each of the above three samples of the chromium-containing material films were produced. The composition analysis of the chromium-containing material films was performed using ESCA (JPS-9000MC, manufactured by JEOL).

These samples were compared with one another with respect to an etching rate (clear time) of a 44-nm thick chromium-containing film with chlorine-containing dry-etching including oxygen.

Figure 5:
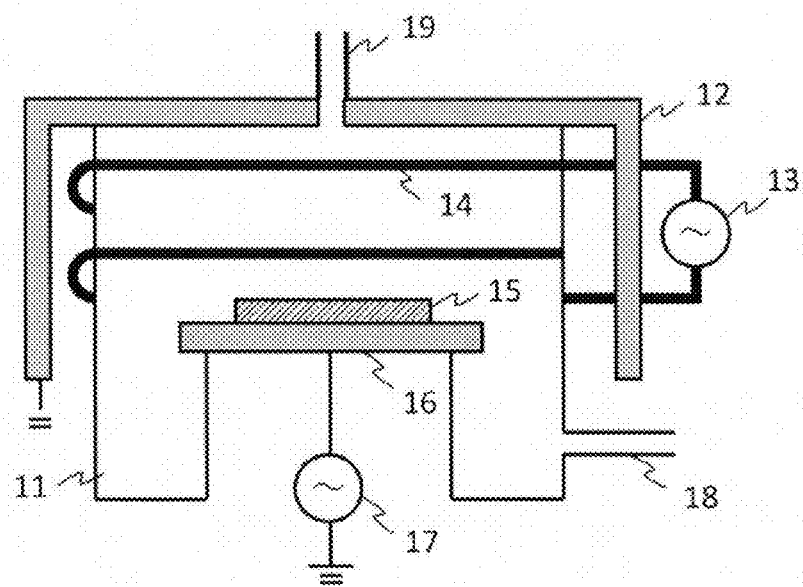
FIG. 5 is a diagram schematically illustrating the configuration of a device used for dry-etching.

FIG. 5 is a diagram schematically illustrating the configuration of a device used for chlorine-containing dry-etching including oxygen. In the figure, reference numeral 11 denotes a chamber, 12 denotes a counter electrode, 13 denotes a high frequency oscillator for inductively coupled plasma (ICP), 14 denotes an antenna coil, 15 denotes a sample, 16 denotes a flat electrode, 17 denotes a RIE high frequency oscillator, 18 denotes an exhaust opening, and 19 denotes a gas inlet. FIG. 5 also serves as a diagram schematically illustrating the configuration of a device used for fluorine-containing dry etching as described below.

Dry etching was performed under the following conditions: The inner pressure of the chamber was set to 6 mTorr, Cl$_2$ (185 sccm), O$_2$ (55 sccm), and He (9.25 sccm) were supplied as etching gas, a voltage of 700 V (pulse) was applied to the RIE high frequency oscillator 17, and a power of 400 W (continuous discharge) was supplied to an ICP-generation high frequency oscillator 13.

Clear times of the respective samples of Example 1, Example 2, and Comparative Example when chlorine-containing dry-etching including oxygen was performed under the above conditions were obtained from reflectance measurements on these samples. The results are shown in Table 1. Here, the clear times are represented by a value relative to the clear time of a sample in Comparative Example defined as 1.

TABLE 1

| Sample | Sn/Cr (mol/mol) | Clear time (Relative value) |
| --- | --- | --- |
| Example 1 | 0.19 | 0.63 |
| Example 2 | 0.11 | 0.85 |
| Comparative Example | 0.0 | 1 |

As is evident from the above results, the samples of Examples 1 and 2, which contains tin in a CrON film showed an increase in etching rate at the time of chlorine-containing dry-etching including oxygen as compared with the sample of Comparative Example, which does not contain Sn.

These samples were compared with one another with respect to the dry-etching rate (clear time) of the CrON film of 44 nm in film thickness. This fluorine-containing dry etching was performed under the following conditions: The inner pressure of the chamber was set to 5 mTorr, SF$_6$ (18 sccm) and O$_2$ (45 sccm) were supplied as etching gas, a voltage of 54 V (continuous discharge) was applied to the RIE high frequency oscillator 17, and a power of 325 W (continuous discharge) was supplied to the ICP-generation high frequency oscillator 13.

Clear times of the respective samples of Example 1, Example 2, and Comparative Example when fluorine-containing dry etching was performed under the above conditions were obtained from reflectance measurements on these samples. The results are shown in Table 2. Then, the ratio of clear time of the fluorine-containing dry etching to the clear time of the chlorine-containing dry-etching containing oxygen.

TABLE 2

| Sample | Sn/Cr (mol/mol) | Clear time ratio |
| --- | --- | --- |
| Example 1 | 0.19 | 13.6 |
| Example 2 | 0.11 | 11.1 |
| Example | 0 | 10.3 |

As is evident from the above results, In each of the samples of Examples 1 and 2, which contain tin in the CrON film, in comparison with the sample of Comparative Example, which does not contain Sn, there is an increase in ratio of clear time of the fluorine-containing dry etching to the clear time of the chlorine-containing dry-etching containing oxygen. Specifically, the ratio between the clear time of the chlorine-containing dry-etching including oxygen and the clear time of the fluorine-containing dry etching is 1:11.

EXAMPLES

Example 1

A half-tone phase shift film (75 nm in film thickness) made of molybdenum, silicon, oxygen, and nitrogen was formed on a quartz substrate by using a direct-current sputtering device.

Using two different targets, a MoSi$_2$ target and a Si target, as targets, film-formation was performed on the quartz substrate in rotation at 30 rpm. Sputtering gas used was Ar and oxygen and adjusted so that the inside of a gas chamber could have a gas pressure of 0.05 Pa.

When the composition of this half-tone phase shift film was investigated by ESCA, it was Mo:Si:O:N=4:1:4 (atomic ratio).

On this half-tone phase shift film, a light-shielding film consisting of a light-shielding layer and an anti-reflection layer was formed. As a light-shielding layer, film-formation of a film (23 nm in film thickness) made of chromium, tin, and nitrogen was performed on the half-tone phase shift film by using a direct-current sputtering device.

Using two different targets, a chromium target and a tin target, as targets, film-formation was performed on the quartz substrate in rotation at 30 rpm. Sputtering gas used was Ar and nitrogen and adjusted so that the inside of a gas chamber could have a gas pressure of 0.1 Pa.

When the composition of this light-shielding layer was investigated by ESCA, it was Cr:Sn:N=6:1:2 (atomic ratio).

On the light-shielding layer, film-formation of an anti-reflection layer (23 nm in film thickness) made of chromium, tin, and nitrogen was performed by using a direct-current sputtering device.

Using two different targets, a chromium target and a tin target, as targets, film-formation was performed on the quartz substrate in rotation at 30 rpm. Sputtering gas used was nitrogen and oxygen and adjusted so that the inside of a gas chamber could have a gas pressure of 0.1 Pa.

When the composition of this anti-reflection layer was investigated by ESCA, it was Cr:Sn:N:O=5:1:2:5 (atomic ratio).

Consequently, there was obtained a photomask blank where the half-tone phase shift film made of MoSiON, the light-shielding film made of CrSnN as a light-shielding film, and an anti-reflection layer made of CrSnON are stacked on the quarts substrate.

Subsequently, chemical amplification negative resist was applied 200 nm in thickness, and then subjected to exposure and development to carry out patterning. Next, using this resist pattern as a mask, dry-etching was performed with mixture gas of chlorine and oxygen to pattern the light-shielding film.

Etching was performed under the following conditions: The inner pressure of the chamber was set to 6 mTorr, $Cl_2$ (185 sccm), $O_2$ (55 sccm), and He (9.25 sccm) were supplied as etching gas, a voltage of 700 V (pulse) was applied to the RIE high frequency oscillator 17, and a power of 400 W (continuous discharge) was supplied to an ICP-generation high frequency oscillator 13.

Next, the resist, the light-shielding film, and the half-tone phase shift film are subjected to patterning by carrying out fluorine-containing dry-etching.

The above etching was performed under the following conditions: The inner pressure of the chamber was set to 5 mTorr, $SF_6$ (185 scan) and $O_2$ (45 sccm) were supplied as etching gas, a voltage of 54 V (continuous discharge) was applied to the RIE high frequency oscillator 17, and a power of 325 W (continuous discharge) was supplied to the ICP-generation high frequency oscillator 13.

Subsequently, the resist was removed. Furthermore, in order to remove the unwanted part of the light-shielding film, a resist pattern for protecting a portion where the light-shielding film is left untouched was formed. Under the same etching conditions as those of the above light-shielding film, the light-shielding film was removed by dry-etching with mixture gas of chloride and oxygen.

Finally, the resist was removed. As a result, a half-tone phase shift mask was completed.

[Embodiment 2]

A half-tone phase shift film (75 nm in film thickness) made of molybdenum, silicon, oxygen, and nitrogen was formed on a quartz substrate by using a direct-current sputtering device.

Using two different targets, a $MoSi_2$ target and a Si target, as targets, film-formation was performed on the quartz substrate in rotation at 30 rpm. Sputtering gas used was Ar and oxygen and adjusted so that the inside of a gas chamber could have a gas pressure of 0.05 Pa.

When the composition of this half-tone phase shift film was investigated by ESCA, it was Mo:Si:O:N=4:1:4 (atomic ratio).

On this half-tone phase shift film, a light-shielding film consisting of a light-shielding layer and an anti-reflection layer was formed. As a light-shielding layer, film-formation of a film (23 nm in film thickness) made of chromium, tin, and nitrogen was performed on the half-tone phase shift film by using a direct-current sputtering device.

Using two different targets, a chromium target and a tin target, as targets, film-formation was performed on the quartz substrate in rotation at 30 rpm. Sputtering gas used was Ar and nitrogen and adjusted so that the inside of a gas chamber could have a gas pressure of 0.05 Pa.

When the composition of this light-shielding layer was investigated by ESCA, it was Cr:Sn:N=6:1:2 (atomic ratio).

On the light-shielding layer, film-formation of an anti-reflection layer (23 nm in film thickness) made of chromium, tin, and nitrogen was performed by using a direct-current sputtering device.

Using two different targets, a chromium target and a tin target, as targets, film-formation was performed on the quartz substrate in rotation at 30 rpm. Sputtering gas used was nitrogen and oxygen and adjusted so that the inside of a gas chamber could have a gas pressure of 0.05 Pa.

When the composition of this anti-reflection layer was investigated by ESCA, it was Cr:Sn:N:O=5:1:2:5 (atomic ratio).

Using a direct sputtering device, a hard mask film (10 nm in film thickness) was formed on the anti-reflection layer.

Using a Si target as a target, film-formation was performed on the quartz substrate in rotation at 30 rpm. Sputtering gas used was Ar and oxygen and adjusted so that the inside of a gas chamber could have a gas pressure of 0.05 Pa.

Consequently, there was obtained a photomask blank where the half-tone phase shift film made of MoSiON, the light-shielding film made of CrSnN as a light-shielding film, an anti-reflection layer made of CrSnON, and a film made of SiO are stacked on the quarts substrate.

Subsequently, chemical amplification negative resist was applied 150 nm in thickness, and then subjected to exposure and development to carry out patterning. Next, using this resist pattern as a mask, dry-etching was performed with fluorine gas to pattern the hard mask film.

The above etching was performed under the following conditions: The inner pressure of the chamber was set to 5 mTorr, $SF_6$ (185 sccm) and $O_2$ (45 sccm) were supplied as etching gas, a voltage of 54 V (continuous discharge) was applied to the RIE high frequency oscillator 17, and a power of 325 W (continuous discharge) was supplied to the ICP-generation high frequency oscillator 13.

Next, dry-etching was performed using mixture gas of chlorine and oxygen as etching gas to pattern the light-shielding film.

Dry-etching was performed under the following conditions: The inner pressure of the chamber was set to 6 mTorr, $Cl_2$ (185 sccm), $O_2$ (55 sccm), and He (9.25 sccm) were supplied as etching gas, a voltage of 700 V (pulse) was applied to the RIE high frequency oscillator 17, and a power of 400 W (continuous discharge) was supplied to an ICP-generation high frequency oscillator 13.

Next, using the resist and the light-shielding film as masks, the half-tone phase shift film is subjected to patterning by carrying out fluorine-containing dry-etching. The hard mask on the light-shielding film is also simultaneously removed by this dry etching.

The above etching was performed under the following conditions: The inner pressure of the chamber was set to 5 mTorr, $SF_6$ (185 sccm) and $O_2$ (45 sccm) were supplied as etching gas, a voltage of 54 V (continuous discharge) was applied to the RIE high frequency oscillator 17, and a power of 325 W (continuous discharge) was supplied to the ICP-generation high frequency oscillator 13.

Subsequently, in order to remove the unwanted part of the light-shielding film, a resist pattern for protecting a portion where the light-shielding film is left untouched was formed.

The light-shielding film was removed by dry-etching using mixture gas of chlorine and oxygen under the same etching conditions as those of the above light-shielding film. Finally, the resist was removed. As a result, a half-tone phase shift mask was completed.

As described above, in the present invention, a light-shielding film formed on a half-tone phase shift mask blank is configured as one having a monolayer structure or a multilayer structure, at least one of the layers is a layer made of a chromium-containing material, and at least one of the layers made of a chromium-containing material is made of a chromium-containing material including tin.

The layer made of a chromium-containing material including tin can cause a significant increase in the etching rate at the time of chlorine-containing dry-etching including oxygen.

Thus, burden on the resist pattern or hard mask pattern at the time of transferring a pattern on the light-shielding film is reduced, and therefore it is possible to carry out pattern transfer with high precision. Therefore, since the pattern transfer to the light-shielding film results in high precision patterning, the pattern transfer to the half-tone phase shift film can also result in high precision patterning.

Industrial Applicability

The present invention provides a novel technique that can increase a dry-etching rate of a light-shielding film made of a chromium-containing material while assuring various characteristics, such as optical and chemical characteristics, required for the light-shielding film.

REFERENCE SINS LIST

1 Transparent substrate
2 Half-tone phase shift film
3 Light-shielding film
4 Resist film
5 Resist pattern
6 Hard mask film
11 Chamber
12 Counter electrode
13 High frequency oscillator for ICP development
14 Antenna coil
15 Sample
16 Flat electrode
17 High frequency oscillator for RIE
18 Exhaust opening
19 Gas inlet

The invention claimed is:

1. A half-tone phase shift mask blank, comprising:
a light-shielding film having a monolayer structure or a multilayer structure,
wherein:
the light-shielding film is provided on the half-tone phase shifting layer, and includes at least one layer made of a chromium-containing material;
the at least one layer made of a chromium-containing material is made of a chromium-containing material including tin;
the chromium-containing material is any one of a chromium metal, chromium oxide, chromium nitride, chromium carbide, chromium oxide nitride, chromium oxide carbide, chromium nitride carbide, and chromium oxide nitride carbide; and
the chromium-containing material including tin is any one of a tin-chromium metal, tin-chromium oxide, tin-chromium nitride, tin-chromium carbide, tin-chromium oxide nitride, tin-chromium oxide carbide, tin-chromium nitride carbide, and tin-chromium oxide nitride carbide.

2. The half-tone phase shift mask blank according to claim 1, wherein
the chromium-containing material including tin has a content of tin of not under 0.01 times and not over 2 times the content of chromium in atomic ratio.

3. The half-tone phase shift mask blank according to claim 1, wherein
all the layers of the light-shielding film are made of a chromium-containing material.

4. The half-tone phase shift mask blank according to claim 1, wherein
the half-tone phase shifting layer is made of a material etchable with fluorine-containing dry etching.

5. The half-tone phase shift mask blank according to claim 4, wherein
the material etchable with fluorine-containing dry etching is a silicon-containing material including a transition metal.

6. The half-tone phase shift mask blank according to claim 5, wherein
the silicon-containing material contains molybdenum and silicon, and further contains at least one of nitrogen and oxygen as a light element.

7. The half-tone phase shift mask blank according to claim 1, further comprising
a hard mask film on the light-shielding film, where the hard mask film has etching resistance to chlorine-containing dry-etching including oxygen.

8. The half-tone phase shift mask blank according to claim 7, wherein
the hard mask film contains silicon and further contains at least one of nitrogen and oxygen as a light element.

9. A method for manufacturing a half-tone phase shift mask using a blank according to claim 1, the method comprising the steps of:
subjecting the layer made of the chromium-containing material including tin to an etching process with chlorine-containing dry-etching including oxygen; and
subjecting the half-tone phase shifting layer to an etching process with fluorine-containing dry etching.

* * * * *